(12) United States Patent
Kanzaki et al.

(10) Patent No.: US 9,372,220 B2
(45) Date of Patent: Jun. 21, 2016

(54) INVERTER

(71) Applicants: Takao Kanzaki, Miyoshi (JP); Koichi Sakata, Okazaki (JP); Yusuke Shindo, Nagoya (JP); Yasuaki Igarashi, Toyota (JP)

(72) Inventors: Takao Kanzaki, Miyoshi (JP); Koichi Sakata, Okazaki (JP); Yusuke Shindo, Nagoya (JP); Yasuaki Igarashi, Toyota (JP)

(73) Assignees: TOYOTA JIDOSHA KABUSHIKI KAISHA, Aichi-ken (JP); DENSO CORPORATION, Aichi-ken (JP)

( * ) Notice: Subject to any disclaimer, the term of this patent is extended or adjusted under 35 U.S.C. 154(b) by 442 days.

(21) Appl. No.: 13/738,529

(22) Filed: Jan. 10, 2013

(65) Prior Publication Data

US 2013/0181731 A1 Jul. 18, 2013

(30) Foreign Application Priority Data

Jan. 13, 2012 (JP) ................. 2012-004946

(51) Int. Cl.
*G01R 31/00* (2006.01)
*G01R 31/02* (2006.01)
*G01R 31/42* (2006.01)

(52) U.S. Cl.
CPC ............. *G01R 31/028* (2013.01); *G01R 31/42* (2013.01)

(58) Field of Classification Search
CPC ............ G01R 31/028; G01R 31/3658; G01R 31/31922
USPC ............ 324/750.01, 500, 425, 439, 200, 248, 324/543, 691, 600, 719, 527–537, 750.15, 324/757.02, 763.01, 519, 750.17, 754.28, 324/548, 658
See application file for complete search history.

(56) References Cited

U.S. PATENT DOCUMENTS 8,736,101 B2 * 5/2014 Masuda et al. ............... 307/10.1
2007/0179004 A1 * 8/2007 Endo ............................. 475/116

FOREIGN PATENT DOCUMENTS

| JP | 10-144194 A | 5/1998 |
| JP | 2003-348856 A | 12/2003 |
| JP | 2010-017024 A | 1/2010 |

* cited by examiner

*Primary Examiner* — Melissa Koval
*Assistant Examiner* — Trung Nguyen
(74) *Attorney, Agent, or Firm* — Sughrue Mion, PLLC

(57) ABSTRACT

In a test of discharging a capacitor by electrically turning on a first switching element and a second switching element that are inserted in series in a conductor connecting a positive electrode and a negative electrode of the capacitor, a discharge current that passes through the first and second switching elements tend to apply stress on the first and second switching elements. In this discharge test, while a first control signal for putting the first switching element into a low resistance state is being applied to the first switching element, a second control signal increasing a voltage thereof over time is applied to the second switching element, and application of one of or both of the first and second control signals is stopped when a current detector detects a current. Since a discharge test ends when a limited discharge current starts flowing, stress associated with the discharge test is reduced.

6 Claims, 3 Drawing Sheets

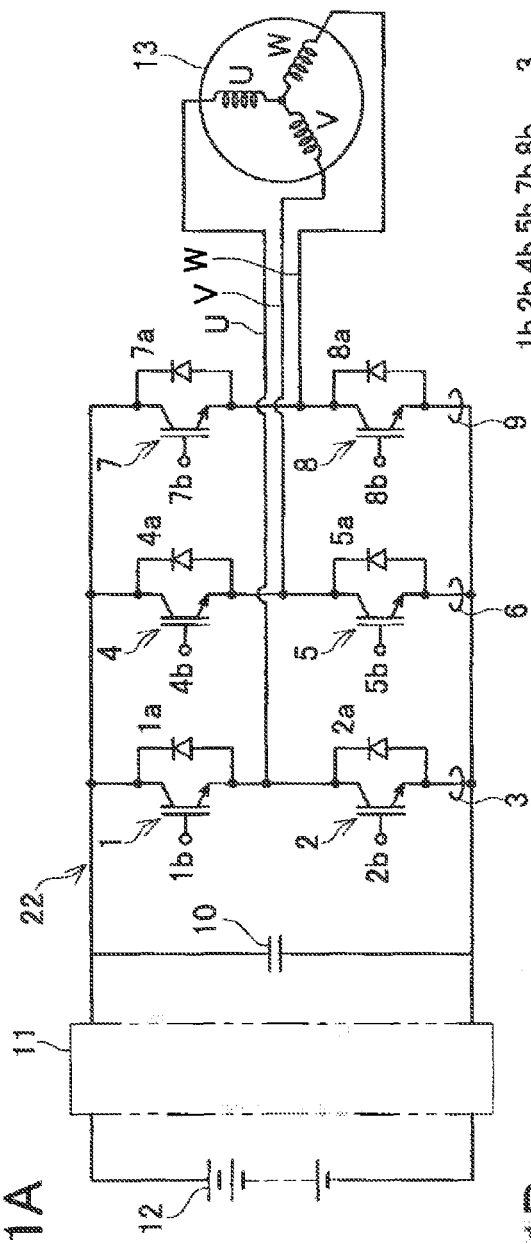
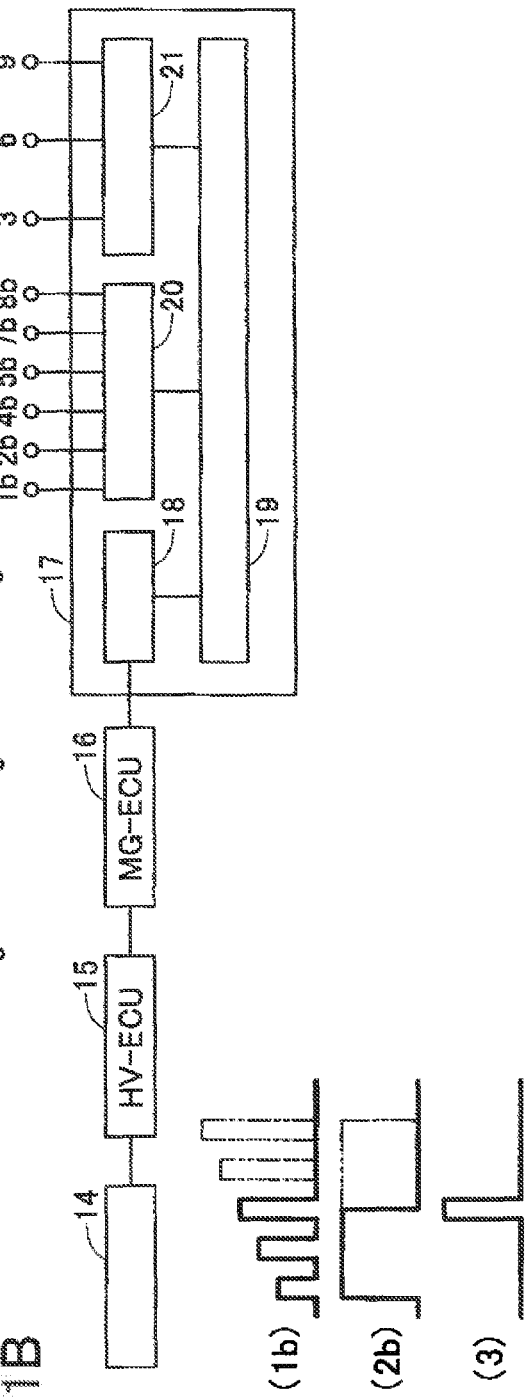
FIG. 1A
FIG. 1B

INVERTER

TECHNICAL FIELD

This specification discloses a technique relating to an inverter that supplies an AC power to an AC motor.

DESCRIPTION OF RELATED ART

An inverter includes a capacitor that smoothes a DC voltage. With the capacitor being charged with a DC voltage, discharging thereof may be required in order to secure safety. For instance, an inverter that is electrically connected to a driving motor of an electric automobile or a hybrid automobile is charged with a high voltage, and the inverter needs to be discharged in the event of a collision accident or checking to secure safety.

The need to discharge the capacitor occurs rarely. However, it is necessary to ensure that the capacitor can be reliably discharged when the need occurs, and a discharge test needs to be performed on a routine basis. For example, a discharge test of the capacitor needs to be performed when an automobile starts driving, when an automobile ends driving, or a period where it is not necessary to rotate a motor (for example, in the case of a driving motor, a period where a shift lever is at the parking position or a period where a brake pedal is depressed and the vehicle speed is zero).

A technique of inserting a switching element in a conductor that connects a positive electrode and a negative electrode of a capacitor in order to discharge the capacitor is known. The capacitor is discharged when the switching element is turned on.

An inverter includes a number of parallel branches corresponding to the number of phases of an AC power and includes at least two switching elements on each branch. For example, an inverter that supplies a 3-phase AC current includes at least six switching elements. Switching elements on the respective branches are turned on and off at different points in time, whereby an AC power of multiple phases is created.

Switching elements that generate an AC power are also inserted in a conductor that connects the positive electrode and the negative electrode of the capacitor, and these switching elements can be used for discharging. In this case, two switching elements are inserted in series in the conductor that connects the positive electrode and the negative electrode of the capacitor. The capacitor is discharged when the two switching elements are turned on concurrently.

Japanese Patent Application Laid-open No. 2003-348856 discloses a technique of using switching elements that generate a 3-phase AC current as discharge switching elements. Japanese Patent Application Laid-open No. H10-144194 discloses a technique of testing a main relay that connects a power source and an inverter when the inverter starts or ends its operation.

By combining the techniques of Japanese Patent Application Laid-open No. 2003-348856 and Japanese Patent Application Laid-open No. H10-144194, it is possible to perform a discharge test of a capacitor at an appropriate point in time such as when the inverter starts or ends its operation.

BRIEF SUMMARY OF INVENTION

When a capacitor is discharged to perform a test, a discharge current may flow into switching elements that are inserted in a conductor that connects the positive electrode and the negative electrode of the capacitor, and the switching elements are heated rapidly. When a discharge test is performed, there is a possibility that load (stress) acts on the switching elements and deterioration of the switching elements is accelerated due to the stress. As disclosed in Japanese Patent Application Laid-open No. 2003-348856, in particular, when a discharge current flows into switching elements that generate an AC power, since a larger current than a normal current that generates an AC power flows, there is a higher possibility that deterioration of the switching elements is accelerated.

This specification discloses a technique of suppressing load (stress) acting on discharge switching elements during a discharge test and preventing deterioration of the discharge switching elements resulting from the discharge test. This technique is useful when a switching element dedicated for discharging is used and is also useful when AC-generation switching elements are used for discharge control.

An inverter disclosed in this specification includes a capacitor having a positive electrode and a negative electrode; a conductor that connects the positive electrode and the negative electrode; a first switching element and a second switching element inserted in series in the conductor; a current detector that detects a conduction current of the conductor; a device that outputs a discharge test start command; and a discharge test execution device.

The discharge test execution device applies a first control signal for putting the first switching element into a low resistance state to the first switching element and a second control signal increasing a voltage thereof over time to the second switching element when the discharge test start command is input. The discharge test execution device stops application of one of or both of the first and second control signals when the current detector detects the conduction current. That is, the discharge test execution device ends a discharge test.

When the discharge test start command is input, the inverter applies the first control signal to the first switching element to put the first switching element into a low resistance state (that is, turns on the first switching element or makes the first switching element conductive in a saturated region). However, since the second switching element is connected in series to the first switching element, a discharge current does not flow just by this.

When the discharge test start command is input, the inverter applies the second control signal to the second switching element. The voltage of the second control signal increases over time. At first, the voltage of the second control signal is low, and the discharge current does not flow. When the voltage of the second control signal increases, the resistance of the second switching element decreases, and the discharge current starts flowing (the first switching element is already in the low resistance state). When the discharge current starts flowing, it is checked that devices associated with a discharge operation operate normally, and the purpose of the test is accomplished. In the inverter, when the current detector detects a current, application of at least one of the first and second control signals is stopped, and discharge is stopped.

According to the inverter, the test ends within a period where a limited discharge current flows, and a large discharge current does not flow. During the discharge test, a large discharge current does not flow into the first and second switching elements, and stress acting on the first and second switching elements can be reduced.

Since the first and second switching elements are connected in series, the connection order is not limited. The first switching element may be disposed closer to the positive electrode of the capacitor, or the second switching element may be disposed closer to the positive electrode of the capacitor. The first and second switching elements may be provided to be dedicated for discharging or may also serve as AC-generation switching elements.

The voltage of the second control signal may increase continuously over time or may increase stepwise over time. When the voltage increases stepwise, an OFF-period may be inserted intermittently like a pulse waveform.

When a capacitor is discharged, the discharge may occur on a path in which a discharge current does not pass through a motor coil (so-called a PCU discharge). In this case, a conductor that is directly connected to the first and second switching elements is used as a discharge path. In the case of a 3-phase AC inverter, for instance, u-phase upper and lower switching elements may be used for discharging. The phase may be a v-phase and a w-phase. Alternatively, multiple phases may be concurrently used for discharge. One to three phases selected from the u-, v-, and w-phases may be used.

Discharge may occur in a path in which a discharge current passes through a motor coil (so-called a MG discharge). For example, a u-phase upper switching element and a v-phase lower switching element may be used for the MG discharge. In this case, the first and second switching elements (in the example, the first and second switching elements are the u-phase upper switching element and the v-phase lower switching element) are connected via a motor coil. In that case, motor torque does not occur even when a discharge current flows through the motor coil. Thus, it is possible to perform a discharge test while allowing a discharge current to flow through the motor coil.

According to the inverter disclosed in this specification, during a discharge test, a large discharge current does not flow into the first and second switching elements, and load (stress) acting on the first and second switching elements is reduced. Thus, it is possible to perform a discharge test without accelerating deterioration of the first and second switching elements.

BRIEF DESCRIPTION OF DRAWINGS

FIG. 1A shows a system configuration of an inverter.
FIG. 1B shows a system configuration of an inverter controller. (1b) (2b) and (3) in FIG. 1B illustrates waveforms used in a discharge test.

DETAILED DESCRIPTION OF INVENTION

Figure 2:
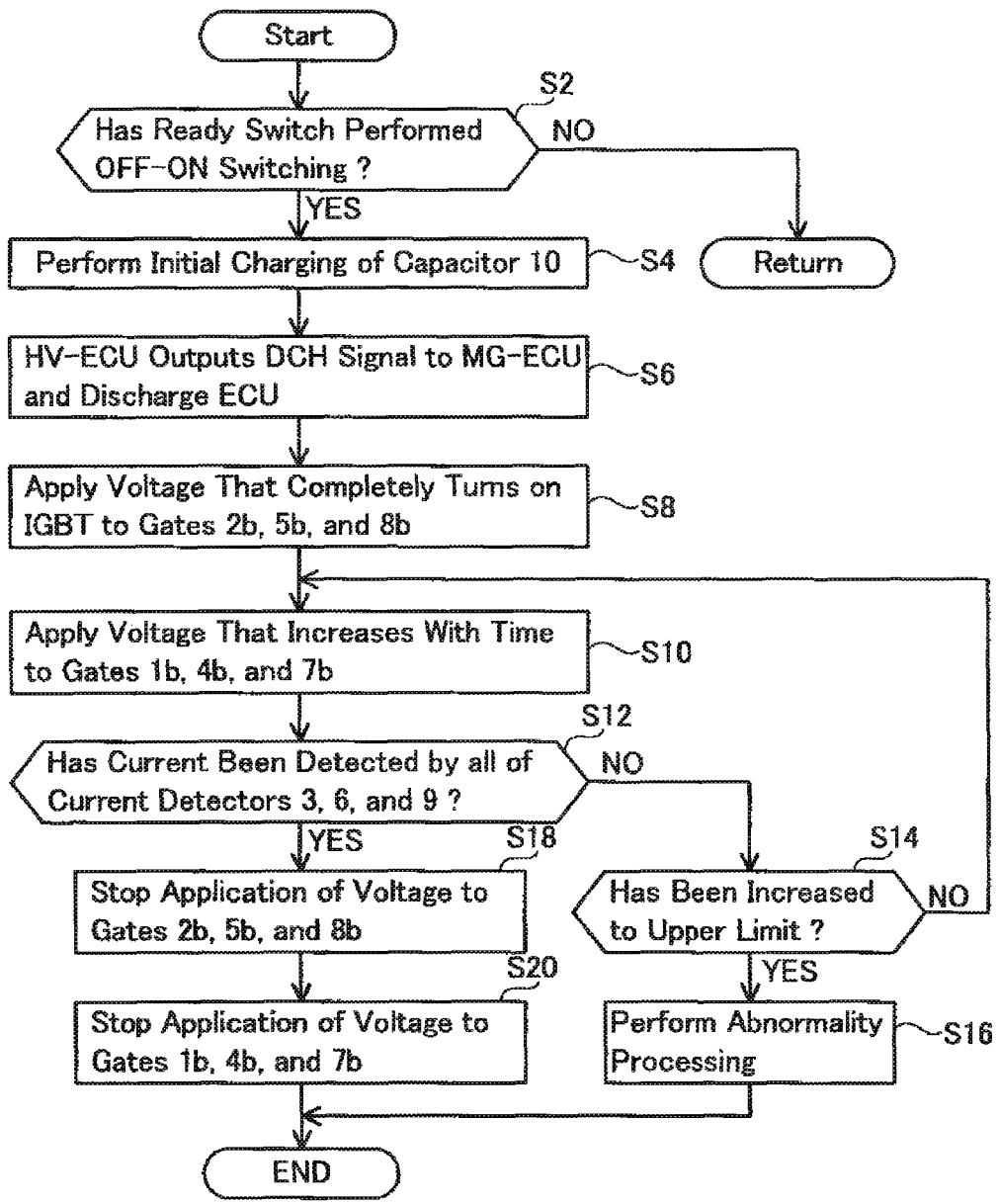
FIG. 2 shows the flow of processes performed by the inverter.

Major features of an embodiment described below are as follows. It is to be noted that the features below may be utilized separately, and it is not indispensable for the features to be utilized in combination with other features.

First feature: An inverter supplies a 3-phase AC current.
Second feature: Switching elements that generate the 3-phase AC current also serve as discharge switching elements.
Third feature: All switching elements (correspond to all phases) of the switching elements that generate the 3-phase AC current are made conductive and perform discharge.
Fourth feature: Discharge tests for three phases are executed concurrently.

Fifth feature: Discharge tests for three phases are executed sequentially.
Sixth feature: Current detector is provided in a common conductor that does not depend on a phase.

Embodiment

FIG. 1A shows a driving force generator that includes a DC power source 12, an inverter 22, and a motor 13. The driving force generator is mounted on an electric automobile or a hybrid automobile, and an automobile runs when the motor 13 rotates. When the automobile brakes, the motor 13 serves as a power generator and charges the DC power source 12. A step-up circuit 11 may be inserted between the DC power source 12 and the inverter 22.

The inverter 22 includes a smoothing capacitor 10. Moreover, the inverter 22 includes a u-phase upper switching element 1, a u-phase lower switching element 2, a u-phase current detector 3, a v-phase upper switching element 4, a v-phase lower switching element 5, a v-phase current detector 6, a w-phase upper switching element 7, a w-phase lower switching element 8, and a w-phase current detector 9. A flywheel diode 1a is connected in parallel to the switching element 1, a flywheel diode 2a is connected in parallel to the switching element 2, a flywheel diode 4a is connected in parallel to the switching element 4, a flywheel diode 5a is connected in parallel to the switching element 5, a flywheel diode 7a is connected in parallel to the switching element 7, and a flywheel diode 8a is connected in parallel to the switching element 8. The above elements are connected by conductors such as wires.

A gate terminal 1b of the u-phase upper switching element 1, a gate terminal 2b of the u-phase lower switching element 2, a gate terminal 4b of the v-phase upper switching element 4, a gate terminal 5b of the v-phase lower switching element 5, a gate terminal 7b of the w-phase upper switching element 7, and a gate terminal 8b of the w-phase lower switching element 8 are connected to an inverter controller. The inverter controller has a function of executing a discharge test.

The inverter controller turns on/off the switching elements 1, 2, 4, 5, 7, and 8 at different points in time to generate a 3-phase AC current so that the generated 3-phase AC current flows into the motor 13. A u-phase current waveform changes with a phase lead of 120° in relation to a v-phase current waveform, and a w-phase current waveform changes with a phase lag of 120° in relation to the v-phase current waveform.

FIG. 1B shows a system configuration of portions of the inverter controller, associated with a discharge test. In this figure, a collision sensor 14 discharges the capacitor 10 to secure safety of occupants when an automobile collision occurs. Thus, the signal of the collision sensor 14 is input to a MG-ECU 16 via a HV-ECU 15. When a collision signal is input, the MG-ECU 16 starts a discharge controller 17. In this case, the discharge controller 17 switches on all of the switching elements 1, 2, 4, 5, 7, and 8. As a result, the capacitor 10 is discharged.

Separately from the above, the HV-ECU 15 outputs a discharge test start command by selecting a period ideal for a test, such as when an automobile starts driving, when an automobile ends driving, or a period where it is not necessary to rotate the motor 13 (for example, a period where a shift lever is at the parking position or a period where a brake pedal is depressed and the vehicle speed is zero). When the discharge test start command is input from the HV-ECU 15 to the MG-ECU 16, the discharge controller 17 executes a discharge test.

When executing the discharge test, the discharge controller 17 applies a gate voltage indicated by (2b) in FIG. 1B to the gate terminals 2b, 5b, and 8b of the switching elements 2, 5, and 8. This gate voltage is a voltage that sufficiently decreases an ON-resistance between the emitter and the collector of each of the switching elements 2, 5, and 8. In this embodiment, the switching elements 2, 5, and 8 correspond to a first switching element. In this embodiment, an IGBT is used for the switching elements 1, 2, 4, 5, 7, and 8. The technique of this embodiment is not limited to a case of using an IGBT but is also useful when using other switching elements such as MOS.

When executing the discharge test, the discharge controller 17 applies a gate voltage indicated by (1*b*) in FIG. 1B to the gate terminals 1*b*, 4*b*, and 7*b*. The gate voltage is set such that the voltage increases with time. In this embodiment, although a gate voltage that increases stepwise is used, a voltage that increases continuously with time may be applied. Moreover, in this embodiment, although a voltage that temporarily reaches zero when the voltage changes stepwise is used, a voltage that does not reach zero may be used. A voltage that changes stepwise can be easily generated by a logic circuit. In this embodiment, the switching elements 1, 4, and 7 correspond to a second switching element.

When the gate voltage of the second switching element 1 increases in a state where the first switching element 2 is in a low resistance state, the second switching element 1 is first in a high resistance state, and a u-phase current does not flow. However, with an increase of the gate voltage of the second switching element 1, the resistance of the second switching element 1 decreases, and a u-phase current (discharge current) starts flowing. The current value when the discharge current starts flowing is small. When a small discharge current flows, this discharge current is detected by the u-phase current detector 3. When a current is detected by the u-phase current detector 3, it can be understood that a PCU discharge device that uses the u-phase operates normally. In this stage, the current value of the u-phase current is small. Thus, it is possible to perform a discharge test without applying stress to the first and second switching elements 2 and 1.

The same test is performed on the v- and w-phases. It can be understood that a PCU discharge device that uses the v-phase operates normally when the v-phase current detector 6 detects a current, and a PCU discharge device that uses the w-phase operates normally when the w-phase current detector 9 detects a current.

In an actual test, the gate voltage applied to the second switching elements 1, 4, and 7 is increased until all of the u-phase current detector 3, the v-phase current detector 6, and the w-phase current detector 9 detect a current. When there is no abnormality in the PCU discharge device, all of the u-phase current detector 3, the v-phase current detector 6, and the w-phase current detector 9 detect a current at an early stage. In this stage, the discharge current values of the u-, v-, and w-phases are all small. Thus, it is possible to perform a discharge test without applying stress to the first switching elements 2, 5, and 8 and the second switching elements 1, 4, and 7.

When all of the u-phase current detector 3, the v-phase current detector 6, and the w-phase current detector 9 detect a current, application of the first control signal to the first switching elements 2, 5, and 8 is stopped, and application of the second control signal to the second switching elements 1, 4, and 7 is stopped. Two-dot chain lines shown in the waveforms indicated by (1*b*) and (2*b*) in FIG. 1B indicate the first control signal (see 2*b*) and the second control signal (see 1*b*) which are scheduled to be applied. The voltage of the second control signal increases with time. Even when the voltage of the second control signal is increased to a certain value, if either one of the u-phase current detector 3, the v-phase current detector 6, or the w-phase current detector 9 does not detect a current, it is determined that there is an abnormality in a discharge device of the corresponding phase. Solid lines in FIG. 1B (1*b*) (2*b*) show a case where there is no abnormality in the discharge device. When a discharge current indicated by (3) in FIG. 1B is detected by all of the u-phase current detector 3, the v-phase current detector 6, and the w-phase current detector 9, application of the first control signal to the first switching elements 2, 5, and 8 and application of the second control signal to the second switching elements 1, 4, and 7 are stopped. As a result, the discharge test ends in a state where the discharge current is maintained to be small.

The discharge controller 17 includes a device 18 that inputs a discharge test start signal from the MG-ECU 16, a controller 19, a device 21 that inputs a detection value detected by each of the u-phase current detector 3, the v-phase current detector 6, and the w-phase current detector 9 to the controller 19, and a gate voltage generation circuit 20 that generates a control signal that is applied to the gate of each of the first switching elements 2, 5, and 8 and the gate of each of the second switching elements 1, 4, and 7 according to an instruction of the controller 19.

FIG. 2 shows the flow of processes during execution of a discharge test. Step S2 is a process of monitoring an arrival of the time to execute a discharge test, and in this process, an arrival of the time when a switch (Ready switch) of an automobile changes from the OFF state to the ON state is monitored. In this embodiment, a discharge test is performed when an automobile starts being used. The time when a discharge test is performed is not limited to the time when an automobile starts being used.

Step S4 and the subsequent steps are performed during execution of the discharge test.

In step S4, initial charging of the capacitor 10 is performed to create a state where the discharge test can be performed.

In step S6, the HV-ECU 15 outputs a DCH signal, and the DCH signal is input to the MG-ECU 16. The DCH signal is a discharge test start command.

In step S8, a voltage (a first control signal) having a magnitude that sufficiently decreases the ON-resistance of each of the first switching elements 2, 5, and 8 is applied to the gates 2*b*, 5*b*, and 8*b* of the first switching elements 2, 5, and 8. If the discharge device operates normally, the first switching elements 2, 5, and 8 enter into a low resistance state.

In step S10, a second control signal is applied to the gates 1*b*, 4*b*, and 7*b* of the second switching elements 1, 4, and 7. The voltage of the second control signal increases with time as indicated by (1*b*) in FIG. 1B.

In step S12, it is determined whether all of the u-phase current detector 3, the v-phase current detector 6, and the w-phase current detector 9 detect a discharge current. If the discharge device operates normally, a determination result of YES is obtained when the process of step S12 is repeated. If the discharge device operates normally, application of the first control signal to the first switching elements 2, 5, and 8 is stopped (step S18), and application of the second control signal to the second switching elements 1, 4, and 7 is stopped (step S20). In this way, the discharge test ends. The automobile finishes an initial checking and enters into a normally usable state.

When a determination result of NO is obtained in step S12, the flow returns to step S10, and the process of step S10 is repeated. The voltage of the second control signal increases as the process of step S10 is repeated.

If there is an abnormality in the discharge device, a determination result of YES is not obtained in step S12 even when the second control signal is increased to an upper limit. If a determination result of YES is obtained in step S14, it can be understood that there is an abnormality in the discharge device. Then, abnormality process is performed in step S16.

In this embodiment, the PCU discharge devices of the u-, v-, and w-phases are used concurrently. Since the u-phase current detector 3, the v-phase current detector 6, and the w-phase current detector 9 are used, it is possible to perform the discharge test for each phase. If there is an abnormality, it is possible to specify a phase where an abnormality occurs.

(First Modification)

Figure 3:
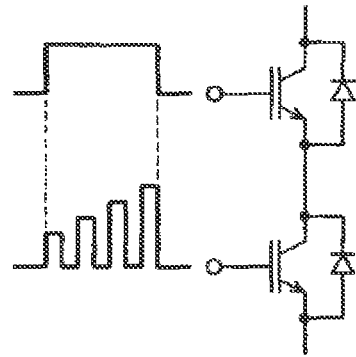
FIG. 3 shows the content of a PCU discharge test.

As shown in FIG. 3, a switching element (upper switching element) closer to the positive electrode may be used as the first switching element, and a switching element (lower switching element) closer to the negative electrode may be used as the second switching element.

(Second Modification)

When a conduction phase used for discharge is determined, it is not necessary to apply a test gate voltage to the switching elements of all phases. Instead, it is necessary to apply a test gate voltage to only a switching element of the conduction phase that is used for discharge.

(Third Modification)

Figure 4:
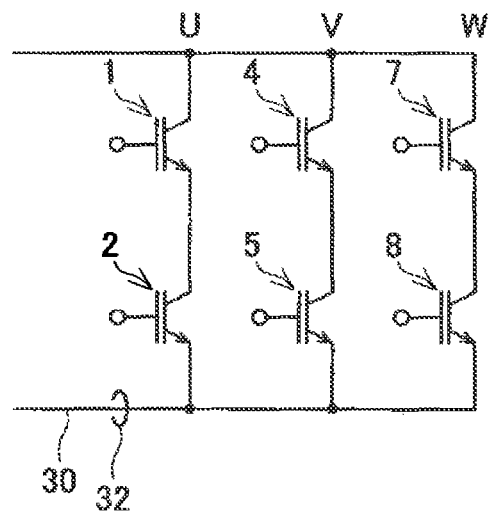
FIG. 4 shows a modification of the content of a PCU discharge test.

Even when discharge is performed using the switching elements of all phases, the discharge test may be performed for each phase. For example, the discharge test may be performed in the order of a u-phase test, a v-phase test, and a w-phase test. In this case, as shown in FIG. 4, one current detector 32 may be provided in a portion that does not depend on a phase (that is, a common wire portion 30).

Even when it is possible to perform a discharge test of all phases concurrently, it is only necessary to test the presence of an abnormality. If it is not necessary to specify an abnormal phase, only one current detector is sufficient as shown in FIG. 4.

(Fourth Modification)

Figure 5:
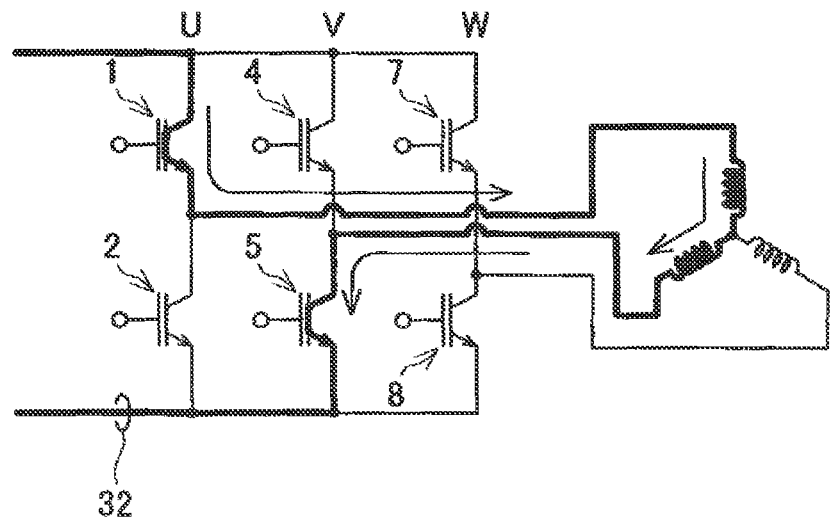
FIG. 5 shows the content of a MG discharge test.

When the phase of a switching element that is made conductive is different between the upper stage and the lower stage, a MG discharge shown in FIG. 5 is realized. In the case of FIG. 5, it can be understood that the u-phase upper switching element 1 and the v-phase lower switching element 5 are introduced in a conductor that connects the positive electrode and the negative electrode of the capacitor, and the u-phase upper switching element 1 and the v-phase lower switching element 5 are connected via a u-phase coil and a v-phase coil of the motor 13. In this case, the technique disclosed in this specification is also effective. That is, when the technique disclosed in this specification is applied using one of the u-phase upper switching element and the v-phase lower switching element as the first switching element and the other switching element as the second switching element, it is possible to test a MG discharge device without applying excessively large stress to the first and second switching elements. A MG discharge may be realized using a combination different from the above example.

Specific embodiment of the present invention is described above, but that merely illustrates some possibilities of the teachings and does not restrict the claims thereof. The art set forth in the claims includes variations and modifications of the specific examples set forth above.

For instance, the conductor connecting the positive electrode and negative electrode may be a wire, metal plate or metal frame.

The technical elements disclosed in the specification or the drawings may be utilized separately or in all types of combinations, and are not limited to the combinations set forth in the claims at the time of filing of the application. Furthermore, the art disclosed herein may be utilized to simultaneously achieve a plurality of aims or to achieve one of these aims.

REFERENCE SIGNS LIST

1: U-PHASE UPPER SWITCHING ELEMENT
2: U-PHASE LOWER SWITCHING ELEMENT
3: U-PHASE CURRENT DETECTOR
4: V-PHASE UPPER SWITCHING ELEMENT
5: V-PHASE LOWER SWITCHING ELEMENT
6: V-PHASE CURRENT DETECTOR
7: W-PHASE UPPER SWITCHING ELEMENT
8: W-PHASE LOWER SWITCHING ELEMENT
9: W-PHASE CURRENT DETECTOR
10: CAPACITOR
11: STEP-UP CIRCUIT
12: DC POWER SOURCE
13: MOTOR
14: COLLISION SENSOR
15: HV-ECU
16: MG-ECU
17: DISCHARGE CONTROLLER (DISCHARGE-ECU)
18: DISCHARGE TEST START SIGNAL INPUT DEVICE
19: CONTROLLER
20: GATE VOLTAGE GENERATOR
21: CURRENT VALUE INPUT DEVICE
22: INVERTER

What is claimed is:

1. An inverter comprising:
a capacitor having a positive electrode and a negative electrode;
a conductor connecting said positive electrode and negative electrode;
a first switching element and a second switching element that are inserted in series in said conductor;
a current detector that detects a conduction current of said conductor;
a device that outputs a discharge test start command; and
a discharge test execution device that applies a first control signal for putting said first switching element into a low resistance state to said first switching element and a second control signal increasing a voltage thereof over time to said second switching element when the discharge test start command is input and stops application of one of or both of said first and second control signals when said current detector detects the conduction current.

2. The inverter according to claim 1, wherein the voltage of said second control signal increases stepwise as time elapses.

3. The inverter according to claim 1, wherein said first and second switching elements are connected directly.

4. The inverter according to claim 1, wherein said first and second switching elements are connected via a motor coil.

5. The inverter according to claim 2, wherein said first and second switching elements are connected directly.

6. The inverter according to claim 2, wherein said first and second switching elements are connected via a motor coil.

* * * * *